United States Patent
Yamashita et al.

(10) Patent No.: US 7,507,497 B2
(45) Date of Patent: Mar. 24, 2009

(54) METHOD AND APPARATUS FOR JUDGING DEGRADATION OF STORAGE BATTERY

(75) Inventors: Shuichi Yamashita, Okazaki (JP); Takeshi Sada, Toyota (JP); Atsushi Hashikawa, Nishio (JP)

(73) Assignees: DENSO CORPORATION, Kariya (JP); Nippon Soken, Inc., Nishio (JP)

( * ) Notice: Subject to any disclaimer, the term of this patent is extended or adjusted under 35 U.S.C. 154(b) by 287 days.

(21) Appl. No.: 11/514,062

(22) Filed: Aug. 31, 2006

(65) Prior Publication Data
US 2007/0054177 A1 Mar. 8, 2007

(30) Foreign Application Priority Data
Sep. 6, 2005 (JP) ............... 2005-258207

(51) Int. Cl.
*H01M 10/44* (2006.01)
*H01M 2/00* (2006.01)
*H01M 10/48* (2006.01)

(52) U.S. Cl. ............... 429/50; 429/61; 429/90

(58) Field of Classification Search .......... 429/50, 429/61, 90
See application file for complete search history.

(56) References Cited

U.S. PATENT DOCUMENTS 3,901,729 A * 8/1975 Duddy ............... 320/147
5,288,563 A 2/1994 Saito et al.

FOREIGN PATENT DOCUMENTS

JP 7-20087 1/1995
JP 09-033620 2/1997

* cited by examiner

*Primary Examiner*—Patrick Ryan
*Assistant Examiner*—Thomas H. Parsons
(74) *Attorney, Agent, or Firm*—Harness, Dickey & Pierce, PLC (57) ABSTRACT

A degradation judgment method, for a storage battery, according to the invention detects generation of a gas (hydrogen, oxygen, etc) after the start of charging of a lead-acid storage battery 10 and measures the electrical characteristics (voltage, current, resistance, etc) of the lead-acid storage battery upon generation of the gas and a gas concentration, a gas generation quantity and a gas generation speed. These measurement values are compared with the results of determination of the relation calculated in advance between the degradation condition and these various quantities and the degradation condition of the lead-acid storage battery is judged.

12 Claims, 7 Drawing Sheets

METHOD AND APPARATUS FOR JUDGING DEGRADATION OF STORAGE BATTERY

BACKGROUND OF THE INVENTION

1. Field of the Invention

This invention relates to a method, and an apparatus using the method, for judging a degradation condition of a lead-acid storage battery used for vehicles, and so forth, by using a gas generated at the time of charging the battery.

2. Description of the Related Art

In a solution-type lead-acid storage battery used for vehicles, etc, a degraded condition has been detected, in the past, by measuring the specific gravity of an electrolyte (sulfuric acid). This measurement of the specific gravity is carried out by opening the battery, taking out a small amount of the electrolyte inside the battery and then conducting-the-measurement. Therefore, this measurement cannot be easily carried out in a battery shop or a gas station. The starting performance of a lead-acid storage battery for vehicles has been measured by causing a large current to flow for several seconds and then measuring the 5-second voltage. As this measurement is carried out by using a current exceeding 100 A, it cannot be easily conducted, similar to the measurement of the specific gravity, and the inspection is limited to a specialized garage. Furthermore, the measurement of a battery capacity is carried out by causing a practical battery to discharge at a predetermined current for a predetermined time. Therefore, the testing time is as long as 20 hours or more, inclusive of a charging time, and it takes a long time for an inspector to test the battery.

The method of judging the start performance of the storage battery from the 5-second voltage involves connecting a large clip equipped with a dummy load to a battery terminal. If the large clip is accidentally removed during the discharge for a short time, a spark can develop and may burn a human body. When the test is conducted immediately after the end of charging, a risk of explosion exists if a spark occurs. From the aspect of safety, therefore, the period of the short-time discharge is preferably as short as possible. If the discharge time is extremely short, however, a transient voltage fluctuation of the discharge is affected by an inductance component of a wiring, having no relation with the start performance of the battery and with capacity degradation, and correct measurement cannot be carried out.

Therefore, Japanese Unexamined Patent Publication No. 7-20087 describes a method that involves fitting a hydrogen ion detection element to a lead-acid storage battery to detect the concentration of sulfuric acid as an electrolyte, and always monitors the charge/discharge condition of the lead-acid storage battery. Japanese Unexamined Patent Publication No. 9-33620 describes a method that involves operating a lead-acid storage battery at a constant current for a short time and thus detects the degradation condition of the lead-acid storage battery.

According to the method of Japanese Unexamined Patent Publication No. 7-20087 that detects the concentration of the electrolyte, however, the detection value varies depending on the fitting position of the detection element because the concentration of the electrolyte is not uniform inside the battery or, in other words, because the concentration is high at the upper layer portion and becomes gradually lower towards the lower layer portion. Therefore, the detection value varies depending on the fitting position and this method cannot be said to be an effective degradation condition detection method.

The degradation judgment method for a lead-acid storage battery described in Japanese Unexamined Patent Publication No. 9-33620 involves the steps of connecting a resistor to a lead-acid storage battery through a switch, closing this switch for 200 μsec to 1 msec to discharge the lead-acid storage battery, measuring a difference between a battery voltage at the time of this discharge and a battery voltage under a stable condition after the discharge, calculating a battery capacity or a 5-second voltage from the difference voltage and judging that the battery is degraded when the voltage is below a predetermined value. According to this method, that utilizes a resistor, however, the change of the internal resistance of the lead-acid storage battery is not proportional to the degree of degradation. Namely, when the degree of degradation is small, the change quantity is small and when the degree of degradation becomes large, the change quantity becomes very large, thereby inviting a large detection error.

SUMMARY OF THE INVENTION

In view of the problems described above, the present invention is aimed at providing a degradation judgment method, for a storage battery, capable of easily and highly accurately judging a degraded condition of a lead-acid storage battery, and an apparatus for practicing the method.

A degradation judgment method for a storage battery according to one aspect of the invention detects a gas generated by an electrolytic action on water inside a lead-acid storage battery at the time of charging of the lead-acid storage battery. When a charging ratio is relatively low during charging, the major proportion of the charging current is stored inside the storage battery but when the charging ratio recovers to a high level, hydrogen and oxygen appear, at a negative plate and a positive plate, respectively, owing to an electrolytic action on water. The electrolytic action on water occurs as the electrode potentials inside the battery reach sufficient values for electrolyzing water. Therefore, the condition of the lead-acid storage battery can be detected by detecting these resulting gases.

In the degradation judgment method of the invention described above, the degradation condition of the lead-acid storage battery is judged by measuring a charging current and a charging voltage simultaneously with detecting the gas generated at the time of charging, and comparing the measurement values with a predetermined current value and a predetermined voltage value. This is based on the finding that for a new lead-acid storage battery and for a degraded lead-acid storage battery, the charging current and the charging voltage are different at the time of generation of the gas during charging. In consequence, the degradation condition can be accurately judged.

In the degradation judgment method of the invention described above, the degradation condition of the lead-acid storage battery is judged by comparing a resistance value calculated from the measured charging current and the measured charging voltage with a predetermined resistance value. It becomes possible in this way to detect the degradation condition even in a lead-acid storage battery placed in a charging system in which a charging current is not constant.

In the degradation judgment method, of the invention, described above, a voltage immediately after the start of charging is stored at the time of charging, a difference from the charging voltage at the time of generation of the gas is calculated and the difference value is compared with a predetermined difference value to judge the degradation condition of the lead-acid storage battery. Electrode potentials in lead-acid storage batteries in general change depending on the concentration (pH) of the electrolyte in the proximity of the electrodes. Therefore, when the change (difference value) between the electrical characteristics of the battery immediately after charging and the electrical characteristics at the time of generation of the gas are compared, the influences of the concentration of the electrolyte contained in the battery are cancelled.

In the degradation judgment method of the invention described above, a charging current is measured at the charging voltage upon generation of the gas at the time of charging of the lead-acid storage battery, a resistance determined from a difference voltage between the voltage immediately after the start of charging and the charging voltage and from the charging current is calculated, and the degradation condition of the lead-acid storage battery is judged by comparing the resistance value so calculated with a predetermined difference resistance value. It is thus possible to cancel the influences of the concentration of the electrolyte and to detect the degradation condition of a lead-acid storage battery in a charging system in which a charging current is not constant.

In the degradation judgment method of the invention described above, the quantity of the gas generated during charging or its concentration or its generation speed, or at least two of them are detected and each of the detection values is compared with a predetermined value to judge the degradation condition of the lead-acid storage battery. This is based on the finding that the quantity of the resulting gas, its concentration and its generation speed are different between a new lead-acid storage battery and a degraded battery.

The degradation judgment method of the invention described above stipulates that the gas is hydrogen or oxygen or both of them.

A degradation judgment apparatus of a lead-acid storage battery according to another aspect of the invention includes gas detection means for detecting a gas generated from inside a lead-acid storage battery; temperature detection means for detecting a temperature inside the lead-acid storage battery; and signal processing means for processing output signals from the gas detection means and the temperature detection means; wherein the condition of the lead-acid storage battery is judged on the basis of data from the signal processing means. This invention is an invention, of the apparatus utilizing the invention, of a method described above and its advantages are the same as those of the invention of a method.

The degradation judgment apparatus described above further includes current/voltage measurement means for measuring a current and a voltage at the start of charging of the lead-acid storage battery and at the time of generation of a gas; wherein the signal processing means can calculate a resistance from the current and the voltage measured by the current/voltage measurement means, and the degradation condition of the lead-acid storage battery is judged by electrical characteristics of the lead-acid storage battery measured or by the difference between values of electrical characteristics at the start of charging and at the time of generation of the gas. This invention is an invention of apparatus utilizing the invention of method described above and its advantages are the same as those of the invention of method.

In the degradation judgment apparatus described above, the gas detection means not only detects the gas but can also detect at least two of a gas quantity, a gas concentration and a gas generation speed, and the degradation condition of the lead-acid storage battery is judged on the basis of these data. This invention is an invention of apparatus utilizing the invention of method described above and its advantages are the same as those of the invention of method.

In the degradation judgment apparatus described above, the gas detection means detects hydrogen or oxygen, or both of them, as the gas.

In the degradation judgment apparatus described above, the gas detection means is installed at a gas exhaust passage of a liquid port plug of the lead-acid storage battery.

A lead-acid storage battery according to another aspect of the invention includes a degradation judgment apparatus described above.

The present invention may be more fully understood from the description of preferred embodiments of the invention, as set forth below, together with the accompanying drawings.

DESCRIPTION OF THE PREFERRED EMBODIMENTS

Figure 1:
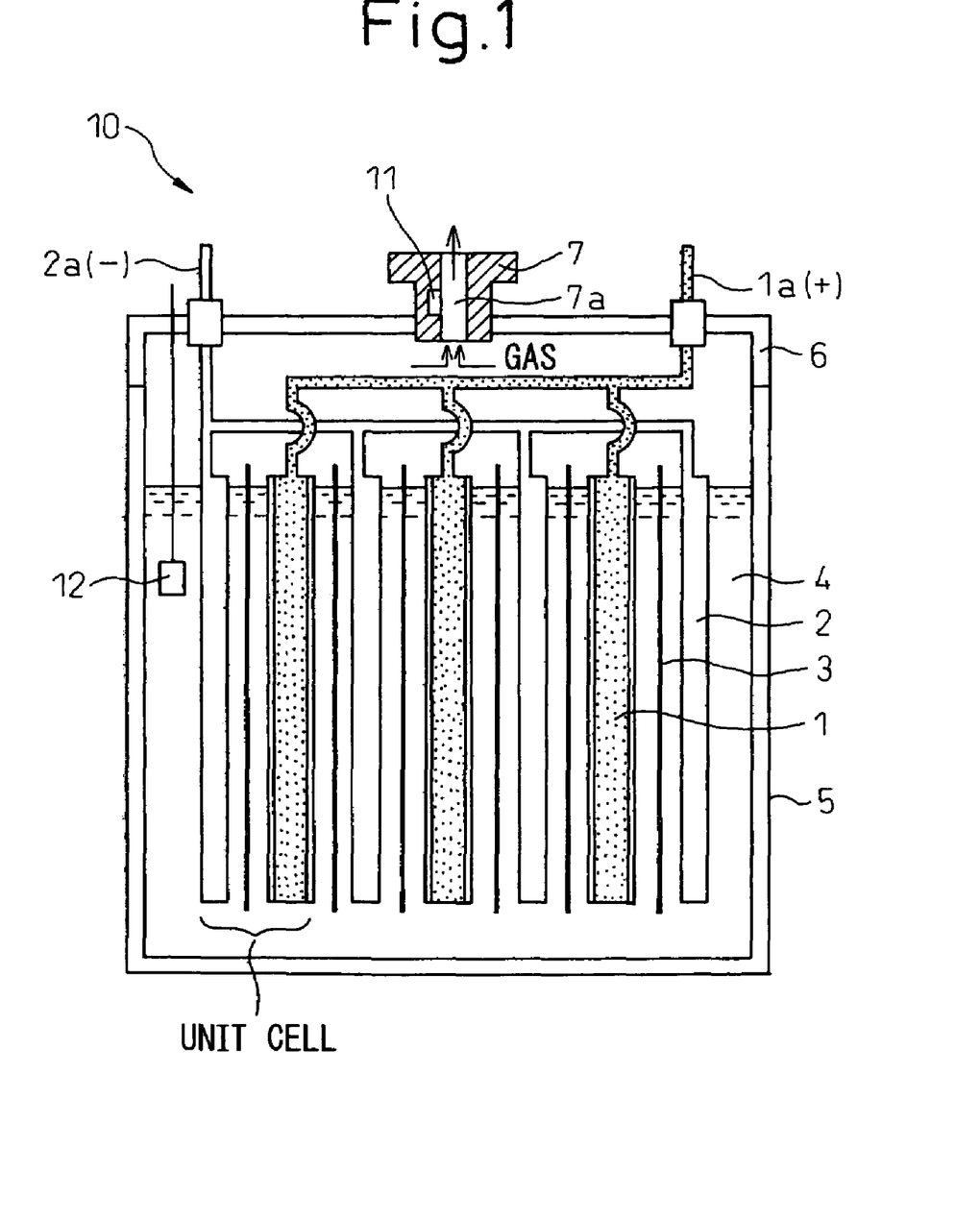
FIG. 1 is a schematic sectional view of a lead-acid storage battery.
Figure 2:
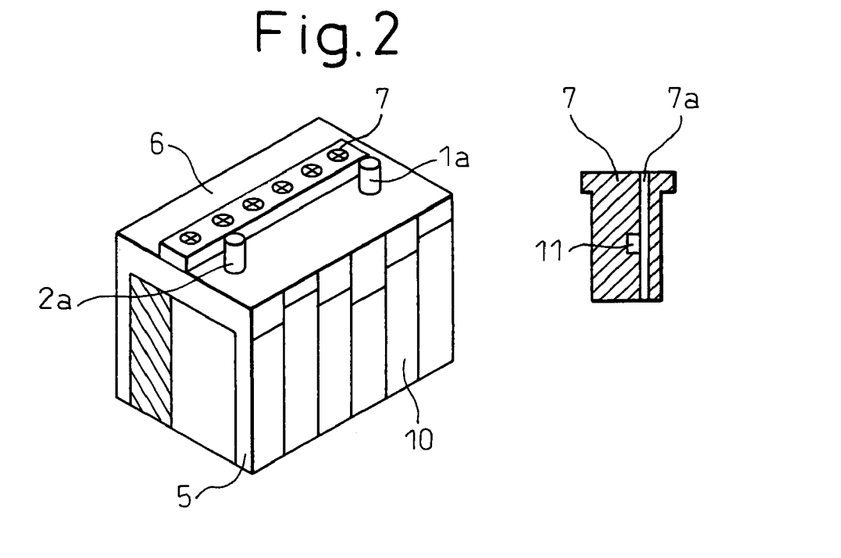
FIG. 2 is an explanatory view for explaining installation of a gas detector into the lead-acid storage battery according to the invention.

A method for judging degradation of a storage battery, and an apparatus for the method according to an embodiment of the invention, will be hereinafter explained with reference to the accompanying drawings. The storage battery of the invention is a lead-acid storage battery, by way of example. FIG. 1 shows a schematic sectional structure of the lead-acid storage battery. FIG. 2 is a perspective view of the lead-acid storage battery and explains an installation of a gas detector. The lead-acid storage battery 10 is the most typical secondary cell and is constituted by a positive plate 1, a negative plate 2, a separator 3, an electrolyte 4, a jar 5 and a cover 6. In other words, the lead-acid storage battery 10 is fabricated by connecting either in parallel or in series a plurality of unit cells each having the negative and positive plates 2 and 1 so arranged as to oppose each other with the separator 3 being in the middle, and accommodating the unit cells into the synthetic resin jar 5 filled with the electrolyte 4.

The positive plate 1 is produced by packing a paste, prepared by kneading lead oxide powder with diluted sulfuric acid, into a grid of lead or a lead alloy, and then conducting drying, aging and formation. The positive plate 1 uses diacidic lead ($PbO_2$) as a positive active material. The negative plate 2 uses a paste type plate prepared in the same way as the positive plate but lead (Pb) is used as a negative active material. The electrolyte 4 uses an aqueous solution of sulfuric acid ($H_2SO_4$).

A positive terminal 1a electrically communicating with the positive plate 1 and a negative terminal 2a electrically communicating with the negative plate 2 are provided in the cover 6. Six liquid port plugs, in total, each corresponding to the unit cell, for supplementing water consumed inside the cell are further provided to the cover 6 as shown in FIG. 2. A gas exhaust passage 7a for exhausting the gas generated inside the cell is formed in each liquid port plug 7 to prevent the rise of the internal pressure of the cell.

The following reaction takes place at each of the negative and positive plates at the time of discharge in the lead-acid storage battery.

Negative plate:

$$Pb+H_2SO_4+2H_2O \rightarrow PbSO_4+2H_3O^++2e^- \quad (1)$$

Positive plate:

$$PbO_2+H_2SO_4+2H_3O^++2e^- \rightarrow PbSO_4+4H_2O \quad (2)$$

In other words, the following reaction occurs as a whole at the time of discharge:

$$PbO_2+Pb+2H_2SO_4 \rightarrow PbSO_4+PbSO_4+2H_2O \quad (3)$$

Reactions reverse to the reactions (1), (2) and (3) take place at the time of charging.

Electrolysis of water occurs at the negative and positive plates as a side reaction when the lead-acid storage battery is charged:

Negative plate:

$$2H_3O^++2e^- \rightarrow H_2+2H_2O \quad (4)$$

Positive plate:

$$3H_3) \rightarrow O_2/2+2H_3O^++2e^- \quad (5)$$

Figure 3:
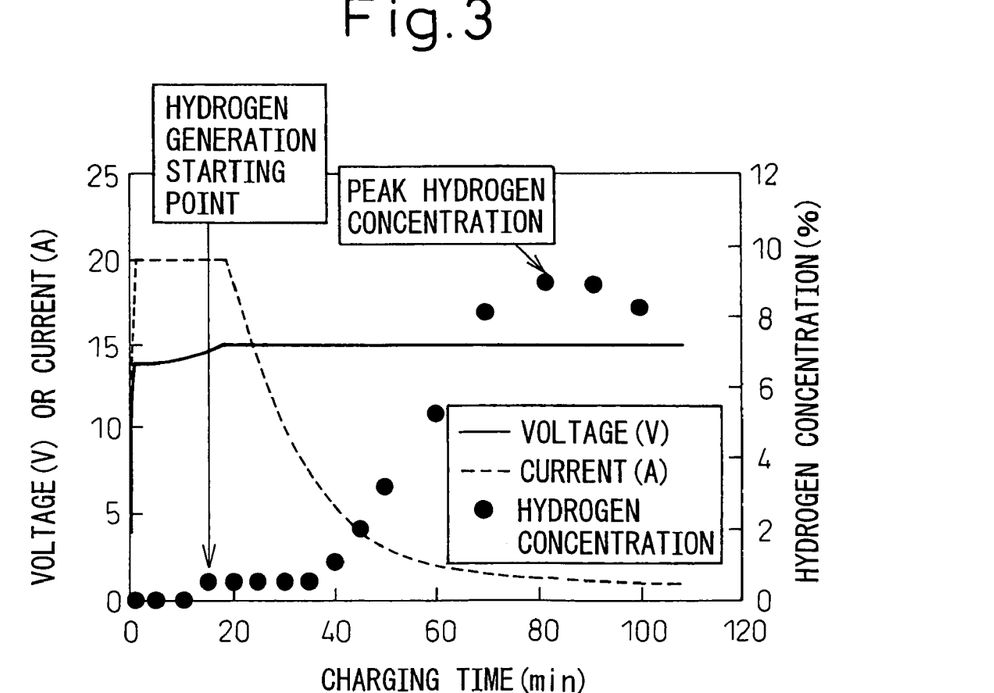
FIG. 3 is a graph showing the changes of a voltage, a current and a hydrogen concentration at the time of charging of the lead-acid storage battery.

FIG. 3 shows the result of an examination of the changes of the voltage, the current and the hydrogen concentration at the time of charging of the lead-acid storage battery. According to this examination, hydrogen starts to appear at the point at which about 15 minutes has passed from the start of charging. Generation of hydrogen is slight in the initial stage but drastically increases after about 40 minutes has passed from the start of charging, and is stabilized at the lower limit from the point at which the hydrogen concentration reaches the peak after about 80 minutes has passed from the start of charging. As for the behavior of the current, the current starts to drastically decreasing from the start of hydrogen generating and is stabilized at the lower limit from the point at which the hydrogen concentration reaches the peak. As for the voltage, the voltage starts increasing from the start of charging and is stabilized at the upper limit from the point at which hydrogen generation starts.

As a result, the major proportion of the charging current is stored inside the battery when the charging ratio is low during charging of the lead acid battery, but hydrogen and oxygen are generated from the negative plate and positive plate, respectively, owing to the electrolytic action on water when the charging ratio reaches to a high level. This electrolytic action on water occurs because the electrode portion inside the battery reaches a sufficient value for electrolyzing water. Therefore, this embodiment detects the condition of the lead-acid storage battery by detecting these resulting gases.

Therefore, this embodiment disposes a gas detector 11 as gas detection means at a gas exhaust passage 7a of each liquid port plug 7. The gas detector 11 may be disposed for each liquid port plug 7 or the gas exhaust passages 7a of the liquid port plugs 7 may be joined at one position and the gas detector 11 may be disposed at that position. Further alternatively, the gas detector 11 may be disposed at the gas exhaust passage 7a of one liquid port plug 7 as a representative position. The gas detector 11 may further be disposed inside the lead-acid storage battery.

Besides the mere detection of the gas, some gas detectors can detect also the amount and concentration of the gas and its generation speed. Furthermore, the gas detector may detect both hydrogen and oxygen as the gas.

Figure 4A:
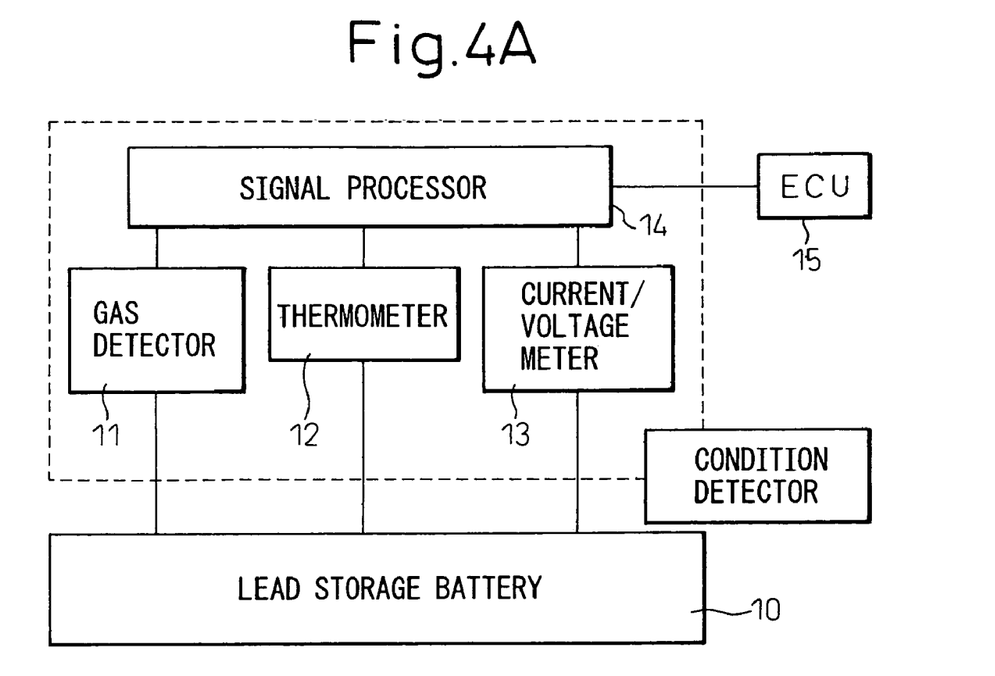
FIGS. 4A and 4B are block diagrams showing degradation judgment apparatuses of a storage battery according to Embodiment 1 (FIG. 4A) and Embodiment 2 (FIG. 4B) of the invention, respectively.
Figure 4B:
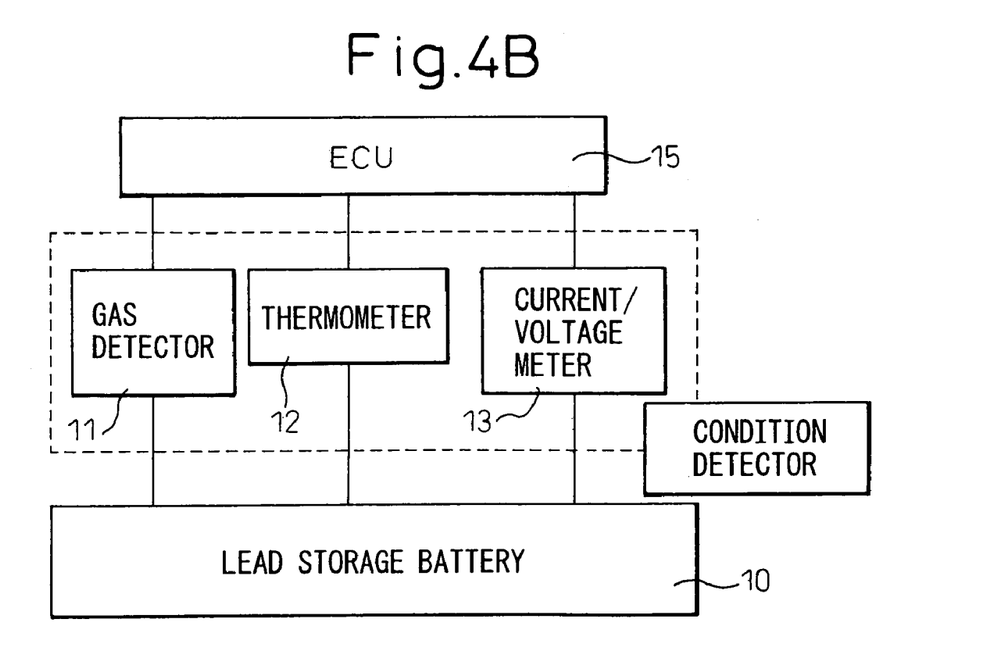

FIGS. 4A and 4B are block diagrams showing degradation judgment apparatuses, for a storage battery, according to Embodiments 1 and 2 of the invention, respectively. In Embodiment 1 shown in FIG. 4A, the degradation judgment apparatus includes a gas detector 11 as gas detection means, a thermometer 12 as temperature detection means for detecting the temperature inside the lead-acid storage battery, a current/voltage meter 13 as current/voltage measurement means for measuring a current and a voltage of the storage battery and a signal processor 14 as signal processing means for processing output signals from the gas detector 11, the thermometer 12 and the current/voltage meter 13. The reason why the gas detector 11 is able to detect not only the gas but also the amount, concentration and generation speed of the gas is because they have a correlation with degradation of the lead-acid storage battery 10 and the degradation condition of the lead-acid storage battery 10 can be judged from them as will be described later.

The thermometer 12 is disposed inside the electrolyte 4 of the lead-acid storage battery 10 as shown in FIG. 1. The temperature inside the lead-acid storage battery 10 has a close relation with the occurrence condition of the gas. The occurrence of the gas is promoted when the temperature is high and is suppressed when the temperature is low. Therefore, the judgment value of the condition of the lead-acid storage battery 10 is corrected by the temperature. The current/voltage meter 13 measures the electrical characteristics of the lead-acid storage battery 10 at the start of charging and during the occurrence of the gas and compares them. In this way, the degradation condition of the lead-acid storage battery 10 can be judged.

In Embodiment 1 shown in FIG. 4A, the output signals from the gas detector 11, the thermometer 12 and the current/voltage measure 13 are sent to the signal processor 14 as signal calculation means and the result is calculated there. The signal processor 14 calculates a resistance from the current and the voltage that are measured. The data processed by the signal processor 14 is sent to an electronic control unit (ECU) 15.

In Embodiment 2 shown in FIG. 4B, the signal processor 14 is built in the ECU 15.

Figure 5:
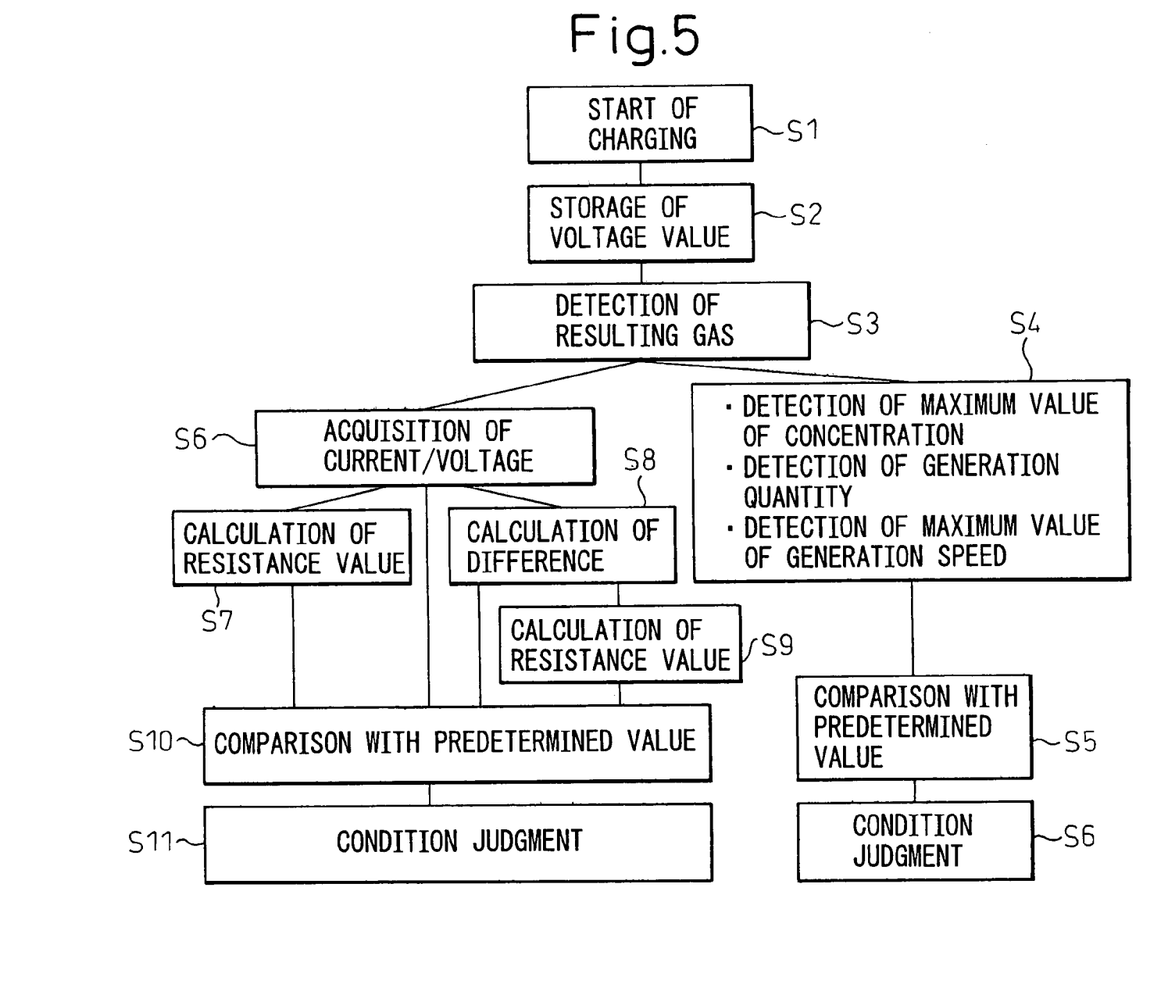
FIG. 5 is a flowchart showing a degradation judgment method of a storage battery according to an embodiment of the invention.

FIG. 5 shows, by a flowchart, a degradation judgment method of the storage battery according to this embodiment.

To begin with, charging of the lead-acid storage battery 10 is started in Step S1. Next, the current/volt meter 13 measures the voltage immediately after the start of charging in Step S2 and the ECU 15 stores the measurement value. The gas detector 11 detects the gas generated inside the lead-acid storage battery 10 in Step S3. The flow shifts to the flow of degradation judgment when a charging ratio of the lead-acid storage battery 10 is restored to a high level and the battery reaches a predetermined condition.

Figure 6:
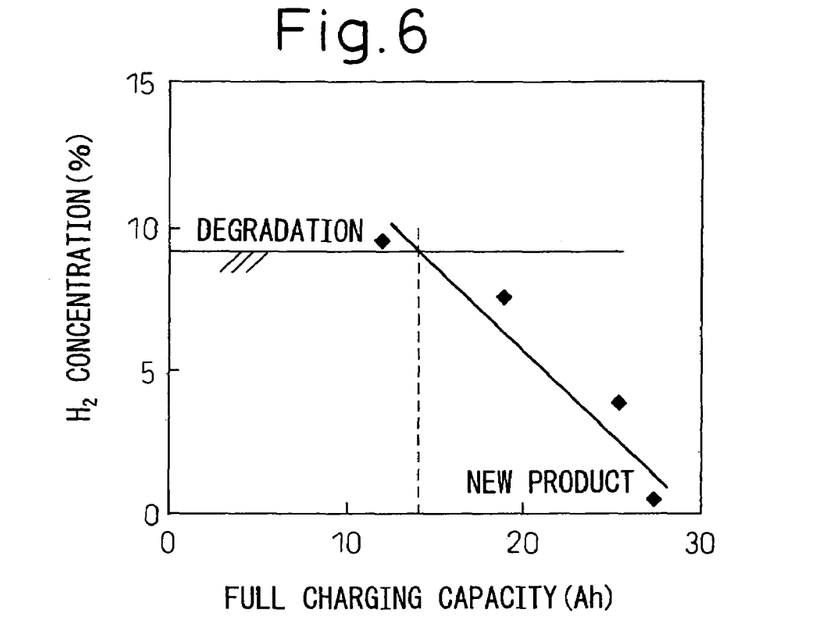
FIG. 6 is a graph showing the change of a resulting hydrogen concentration owing to degradation of the lead-acid storage battery.

The following five methods are conceivable as the degradation judgment flow (method). In the first degradation judgment method, the flow proceeds to Step S4 when the occurrence of the gas is detected in Step S3, and the gas detector 11 detects the maximum value of the concentration of the resulting gas or the generation quantity of the gas, or the maximum value of the occurrence speed of the gas or at least two of them. Next, the flow proceeds to Step S5 where the detected value is compared with a predetermined value to judge the degradation condition in Step S6'. In other words, the full charging capacity (Ah) is large when the lead-acid storage battery 10 is new and the concentration of hydrogen generated (%) is low when hydrogen is detected as the generation gas as shown in FIG. 6. The full charging capacity (Ah) becomes smaller with the progress of degradation of the battery, the hydrogen concentration (%) is likely to become higher. Therefore, the hydrogen concentration of about 9% is set as the judgment value (predetermined value) and when the concentration of the resulting hydrogen exceeds 9%, the battery is judged as being degraded. Other generation quantities and generation speeds are not shown as the graph but, because the observation regarding the concentration also holds true, the degradation condition of the lead-acid storage battery 10 can be judged by setting a predetermined value and comparing it with the detection value. The same observation also holds true of oxygen. When oxygen is utilized as the detection gas, however, the detection accuracy may drop because oxygen exists in the air.

Figure 7:
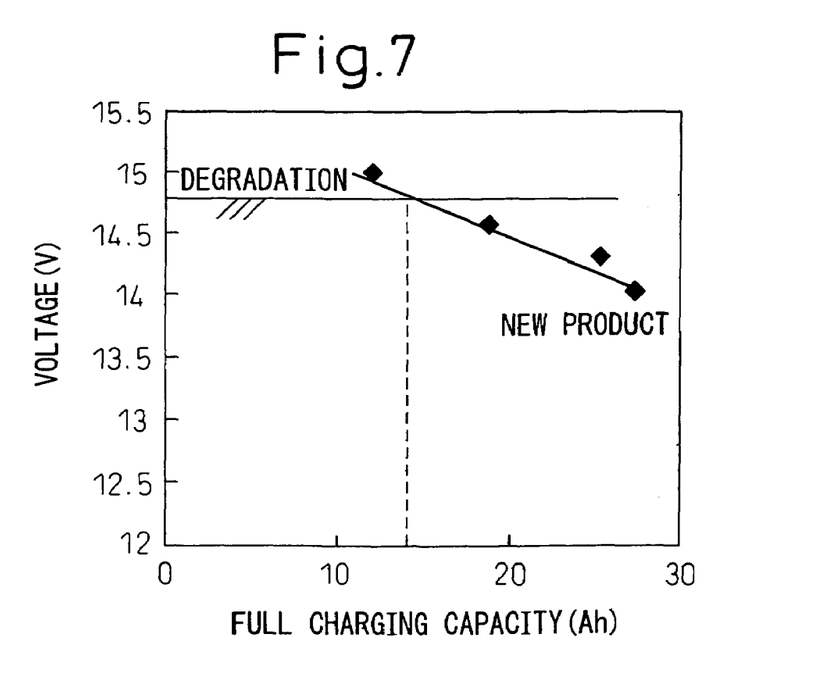
FIG. 7 is a graph showing the change of a charging voltage at the time of generation of hydrogen owing to degradation of the lead-acid storage battery.
Figure 8:
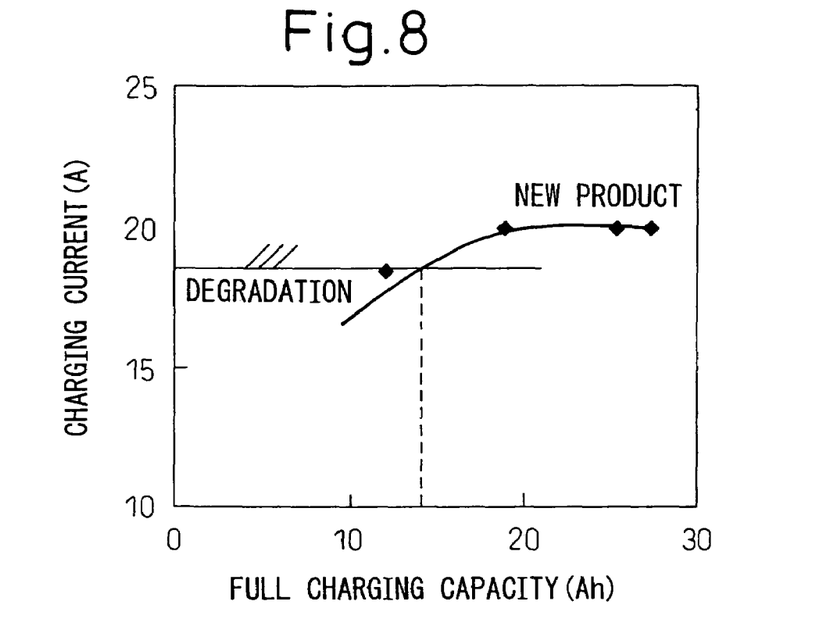
FIG. 8 is a graph showing the change of a charging current at the time of generation of hydrogen owing to degradation of the lead-acid storage battery.

According to the second degradation judgment method, the flow proceeds to Step S6 when the gas occurs in Step S3 and the current and the voltage at the time of generation of the gas are measured by the current/volt meter 13. The flow then proceeds to Step S10 and these measurement values are compared with predetermined values so as to judge the degradation condition in Step S11. In other words, when hydrogen is detected as the generation gas, the full charging capacity (Ah) is large when the lead storage battery 10 is new and the voltage (V) is low. Whereas the full charging capacity (Ah) becomes smaller with the progress of degradation of the battery, the voltage (V) at that time is likely to become higher. Therefore, the voltage at the time of full charging capacity of about 14.8 V is set as the judgment value (predetermined value) and when the voltage exceeds this value, a degradation judgment is made as shown in FIG. 7. As for the current, the full charging capacity (Ah) is large and there is the upper limit to the charging current (A) at that time when the lead storage battery 10 is new. However, the full charging capacity (Ah) becomes smaller with the progress of degradation. Though the charging current (A) does not drop much at the beginning, it is likely to gradually drop with the progress of degradation. Therefore, a current of about 18.5 A at the time of the full charging capacity (Ah) is set as the judgment value (predetermined value) and the battery is judged as becoming degraded when the current is smaller than this value as shown in FIG. 8. The degradation condition of the lead-acid storage battery can be judged by a similar method even when the gas is oxygen or contains both oxygen and hydrogen.

Figure 9:
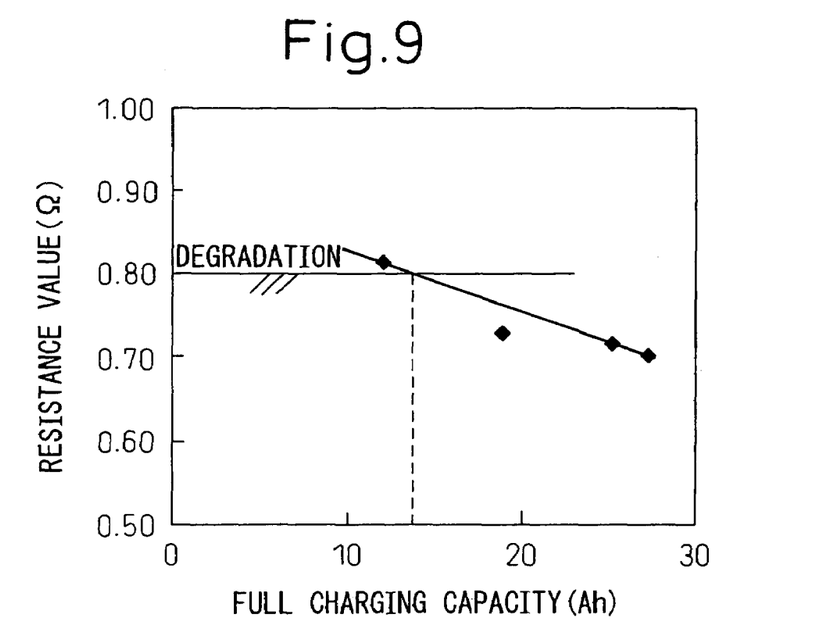
FIG. 9 is a graph showing the change of a resistance value calculated from current-voltage at the time of generation of hydrogen owing to degradation of the lead-acid storage battery.

According to the third degradation judgment method, the flow proceeds to Step S7 after the current and the voltage at the time of generation of the gas are measured by the current/voltage meter 13 and the resistance value is calculated on the basis of the current value and the voltage value measured by the signal processor 14. Next, the flow proceeds to Step S10 and the calculated resistance value is compared with a predetermined resistance value to judge the degradation condition in Step S11. In other words, in the case of hydrogen as the gas being generated, the full charging capacity (Ah) is large when the lead-acid storage battery 10 is new and its resistance value ($\Omega$) is low. Whereas the full charging capacity (Ah) becomes smaller with the progress of degradation of the battery, the resistance value ($\Omega$) at that time is likely to become larger. Therefore, the resistance value about 0.80 $\Omega$ is set as the judgment value (predetermined value) and when the resistance value exceeds this value, the battery is judged to be becoming degraded as shown in FIG. 9. The degradation condition of the lead-acid storage battery can be judged by a similar method even when the gas is oxygen or contains both oxygen and hydrogen.

Figure 10:
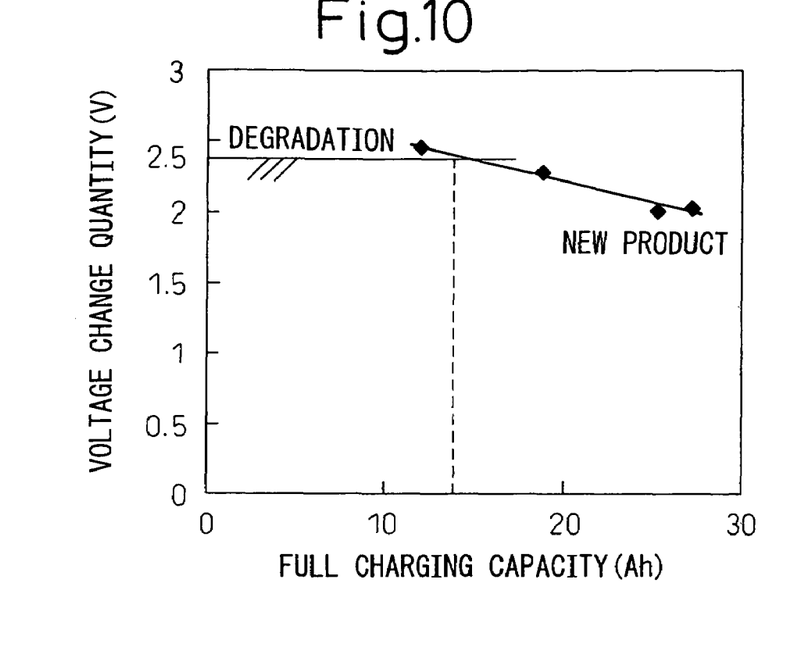
FIG. 10 is a graph showing the difference between a voltage at the time of generation of hydrogen owing to degradation of the lead-acid storage battery and a voltage immediately after the start of charging.

According to the fourth degradation judgment method, the current and the voltage at the time of the generation of the gas are measured in Step S6 and the flow then proceeds to Step S8, where the difference (change quantity) between the voltage at the start of charging, that is measured in Step S2, and the voltage at the time of generation of the gas, that is measured in Step S6, is calculated. Next, the flow proceeds to Step S10, where the difference value (voltage change quantity) calculated in Step S6 is compared with a predetermined difference value to judge the degradation condition in Step S11. In other words, as to the change quantity (V) from the voltage immediately after the start of charging to the voltage at the time of generation of hydrogen when hydrogen is detected as the generation gas and charging is done at a constant current from a predetermined battery condition (charging ratio of 0%, for example) as shown in FIG. 10, for example, the full charging capacity (Ah) is large and the voltage change quantity (V) is small when the lead-acid storage battery 10 is new but, as degradation of the battery proceeds, the full charging capacity (Ah) becomes smaller whereas the voltage change quantity is likely to become larger. Therefore, the voltage change quantity of about 2.4 V at the time of full charging capacity is set as a judgment value (predetermined value) and the battery is judged as becoming degraded when the voltage change quantity exceeds this predetermined value. The degradation condition of the lead-acid storage battery can be judged by a similar method when the gas is oxygen or contains both oxygen and hydrogen.

Figure 11:
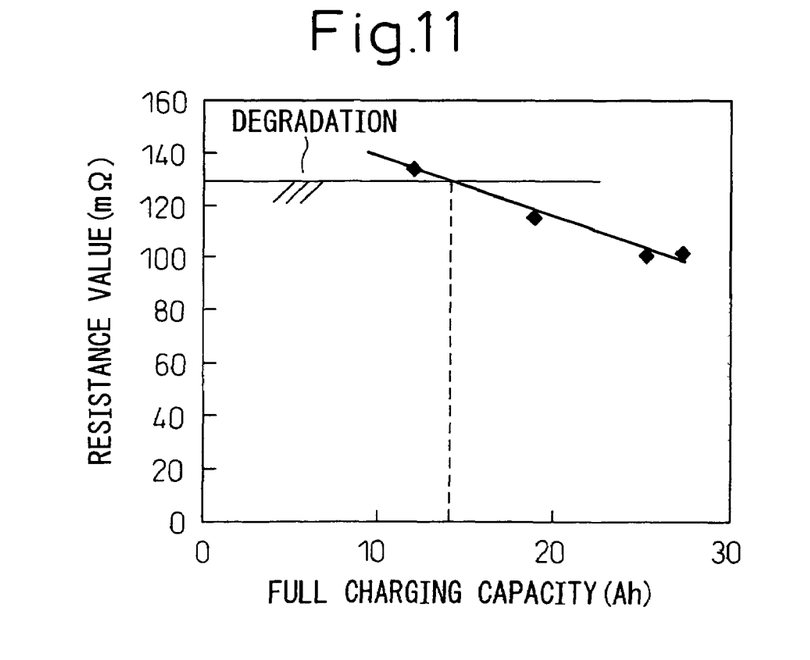
FIG. 11 is a graph showing the resistance value calculated from current at the time of generation of hydrogen owing to degradation of the lead-acid storage battery and the voltage at the time of generation of hydrogen.

According to the fifth degradation judgment method, the flow proceeds to Step S9 after the difference, (change quantity) between the voltage at the start of charging that is measured in Step S2 and the voltage at the time of generation of the gas that is measured in Step 6, is calculated. In Step S9, the resistance is calculated by using the difference value (change quantity) calculated in Step S8 and the current at the time of generation of the gas that is measured in Step S6. Next, the flow proceeds to Step S10 and the resistance value calculated in Step S9 is compared with a predetermined difference resistance value to judge the degradation condition in Step S11. The resistance value (m$\Omega$) calculated from the current at the time of generation of hydrogen and from the difference voltage (voltage change quantity) between the voltage immediately after the start of charging and the voltage at the time of generation of hydrogen in the case of hydrogen as the generation gas when the battery is charged at a constant current from a predetermined battery condition (charging ratio of 0%, for example), as shown in FIG. 11 is now considered. When the lead-acid storage battery is new, the full charging capacity (Ah) is large and the resistance value (mΩ) calculated from the voltage change quantity is small. As degradation of the storage battery proceeds, however, the full charging capacity (Ah) becomes smaller whereas the resistance value (mΩ) is likely to increase. Therefore, a resistance value of about 130 mΩ at the time of the full charging capacity is set as the judgment value (predetermined value) and the battery is judged as becoming deteriorated when this value is exceeded. The degradation condition of the lead-acid storage battery can be judged by a similar method when the gas is oxygen or contains both oxygen and hydrogen.

Incidentally, when the discharge is started without reaching the generation of the gas after the start of charging in the methods described above, similar condition detection is conducted on a separate occasion.

The term "degradation condition of the lead-acid storage battery" used in the invention represents that the lead-acid storage battery is under the state such as sulfation (where the crystals of lead-acid sulfate become so large that the original state of the battery cannot be recovered even when charging is done), a loss of solution, excessive water supplementation, grid corrosion, and softening.

As explained above, the present invention detects the generation of the gas after the start of charging of the lead-acid storage battery, detects the electrical characteristics of the storage battery and the concentration, quantity and generation speed of the gas, and judges the degradation condition of the lead-acid storage battery by comparing these measurement values with the results of determination of the relation calculated in advance between the degradation condition and these factors. Because generation of the gas and the electrical characteristics at the time of generation are thus detected, it becomes possible to not only easily detect the condition of the lead-acid storage battery but also to individually detect degradation of the positive plate and negative plate of the lead-acid storage battery and degradation of the electrolyte depending on the kind of the gas detected.

While the invention has been described by reference to specific embodiments chosen for purposes of illustration, it should be apparent that numerous modifications could be made thereto, by those skilled in the art, without departing from the basic concept and scope of the invention.

The invention claimed is:

1. A degradation judgment method, for a lead-acid storage battery for judging a degradation condition of the lead-acid storage battery, the method comprising:

detecting a condition of said lead-acid storage battery by detecting a gas generated by an electrolytic action on water inside said lead-acid storage battery at the time of charging of said lead-acid storage battery; wherein the degradation condition of said lead-acid storage battery is judged by measuring a charging current and a charging voltage simultaneously with detection of the gas generated at the time of charging of said lead-acid storage battery, and comparing the measured values with a predetermined current value and a predetermined voltage value.

2. A degradation judgment method, according to claim 1, wherein the degradation condition of said lead-acid storage battery is judged by comparing a resistance value, calculated from the measured charging current and the measured charging voltage, with a predetermined resistance value.

3. A degradation judgment method, according to claim 1, wherein said gas is hydrogen or oxygen or both of them.

4. A degradation judgment method for a lead-acid storage battery for judging a degradation condition of the lead-acid storage battery, the method comprising:

detecting a condition of said lead-acid storage battery by detecting a gas generated by an electrolytic action on water inside said lead-acid storage battery at the time of charging of said lead-acid storage battery; wherein a voltage immediately after the start of charging is stored at the time of charging of said lead-acid storage battery, a difference from the charging voltage at the time of generation of the gas is calculated and the difference is compared with a predetermined difference value to judge the degradation condition of said lead-acid storage battery.

5. A degradation judgment method, according to claim 4, wherein a charging current is measured with the charging voltage upon generation of the gas at the time of charging of said lead-acid storage battery, a resistance determined from a difference voltage between the voltage immediately after the start of charging and said charging voltage and from the charging current is calculated, and the degradation condition of the lead-acid storage battery is judged by comparing the resistance value so calculated with a predetermined difference resistance value.

6. A degradation judgment method for a lead-acid storage battery for judging a degradation condition of the lead-acid storage battery, the method comprising:

detecting a condition of said lead-acid storage battery by detecting a gas generated by an electrolytic action on water inside said lead-acid storage battery at the time of charging of said lead-acid storage battery; wherein the quantity of the gas generated during charging of said lead-acid storage battery or its concentration or its generation speed or at least two of them are detected and each of the detection values is compared with a predetermined value to judge the degradation condition of said lead-acid storage battery.

7. A degradation judgment apparatus for judging a degradation condition of a lead-acid storage battery, the apparatus comprising:

detection means for detecting a gas generated from inside said lead-acid storage battery;

temperature detection means for detecting a temperature inside said lead-acid storage battery; and signal processing means for processing an output signal from said gas detection means and said temperature detection means;

wherein the condition of said lead-acid storage battery is judged on the basis of data from said signal processing means.

8. A degradation judgment apparatus according to claim 7, further comprising:

current/voltage measurement means for measuring a current and a voltage at the start of charging of said lead-acid storage battery and at the time of generation of a gas;

wherein said signal processing means can calculate a resistance from the current and the voltage measured by said current/voltage measurement means, and the degradation condition of said lead-acid storage battery is judged by the measured electrical characteristics of said lead-acid storage battery or difference values in electrical characteristics between the start of charging and the time of generation of the gas.

9. A degradation judgment apparatus of a storage battery according to claim 7, wherein said gas detection means not only detects the gas but can also detect at least two of a gas quantity, a gas concentration and a gas generation speed, and the degradation condition of said lead-acid storage battery is judged on the basis of these data.

10. A degradation judgment apparatus of a storage battery according to claim 7, wherein said gas detection means detects hydrogen or oxygen, or both of them, as the gas.

11. A degradation judgment apparatus of a storage battery according to claim 7, wherein said gas detection means is installed at a gas exhaust passage of a liquid port plug of said lead-acid storage battery.

12. A lead-acid storage battery including a degradation judgment apparatus according to claim 7.

* * * * *